(12) United States Patent
Garg et al.

(10) Patent No.: US 7,712,060 B1
(45) Date of Patent: May 4, 2010

(54) METHOD AND SYSTEM FOR HANDLING ASSERTION LIBRARIES IN FUNCTIONAL VERIFICATION

(75) Inventors: Tarun Garg, Rohini (IN); Vinaya Kumar Singh, Noida (IN); Pratik Mahajan, Noida (IN); Mohamad Shaved, Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 438 days.

(21) Appl. No.: 11/712,003

(22) Filed: Feb. 27, 2007

(51) Int. Cl.
*G06F 17/50* (2006.01)

(52) U.S. Cl. .............................. 716/5; 716/17; 716/18; 703/16

(58) Field of Classification Search ................ 716/5, 716/17, 18; 703/16
See application file for complete search history.

(56) References Cited

U.S. PATENT DOCUMENTS

| | | | | |
|---|---|---|---|---|
| 5,987,239 | A * | 11/1999 | Kirsch ............................ | 716/1 |
| 6,591,403 | B1 * | 7/2003 | Bass et al. ...................... | 716/5 |
| 6,651,228 | B1 | 11/2003 | Narain et al. | |
| 6,742,166 | B2 * | 5/2004 | Foster et al. .................... | 716/4 |
| 7,188,324 | B1 * | 3/2007 | Qiu et al. ....................... | 716/4 |
| 7,313,772 | B2 * | 12/2007 | Hekmatpour et al. .......... | 716/5 |
| 7,325,209 | B2 * | 1/2008 | Mitra et al. ..................... | 716/5 |
| 7,340,700 | B2 * | 3/2008 | Emerson et al. ................ | 716/4 |
| 7,386,813 | B2 | 6/2008 | Singh et al. | |
| 7,421,668 | B1 * | 9/2008 | Ip et al. .......................... | 716/5 |
| 7,454,324 | B1 * | 11/2008 | Seawright et al. .............. | 703/14 |
| 7,596,770 | B1 | 9/2009 | Kuehlmann et al. | |
| 7,603,636 | B2 * | 10/2009 | Yamada ........................ | 716/4 |
| 2003/0018945 | A1 * | 1/2003 | Foster et al. .................... | 716/5 |
| 2006/0271890 | A1 * | 11/2006 | Hekmatpour et al. .......... | 716/5 |
| 2006/0271904 | A1 * | 11/2006 | Emerson et al. ................ | 716/18 |
| 2007/0074137 | A1 * | 3/2007 | Nishida et al. .................. | 716/5 |
| 2008/0015838 | A1 * | 1/2008 | Stern ............................ | 703/15 |

(Continued)

FOREIGN PATENT DOCUMENTS

JP     2006285626 A    * 10/2006

(Continued)

OTHER PUBLICATIONS

Habibi et al., "On the Design and Verification Methodology of the Look-Aside Interface", 2005 Proceedings of Design, Automation and Test Conference in Europe, Mar. 7-11, 2005, vol. 3, pp. 290-295.*

(Continued)

*Primary Examiner*—Phallaka Kik
(74) *Attorney, Agent, or Firm*—Vista IP Law Group LLP

(57) ABSTRACT

A method and system for handling assertion libraries in verification of a design are disclosed. The method and system include structuring and implementing at least one verification component in at least one of the assertion libraries with at least one standard assertion language supported by at least one verification tool, creating an assertion library element for a specific requirement for verification of the design without dependence on the at least one verification tool for the assertion library element, and resolving assertion status. With the disclosed method and system, visualization of assertion status at various levels of design hierarchy and at verification component level may be achieved, and implementing verification techniques may include optimization techniques during and/or after verification.

34 Claims, 10 Drawing Sheets

```
500
    DUV (101) FAIL(10),CEX1
    |
    +--FIFO1 (102) FAIL(10),CEX1
    |   +--FIFO_vcomp (103) FAIL(10),CEX1
    |       +--FIFO_contorl_vocmp (104) FAIL(10),CEX1
    |       |   +--check_underflow (105) FAIL(10),CEX1
    |       |   +--check_overflow (106) PASS
    |       |
    |       +--FIFO_datapath_vcomp (107) PASS
    |           +--check_data_integrity (108) PASS
    |           +--check_data_sequencing (109) PASS
    |
    +--FIFO2 (110) EXPLORED(20)
    |   +--FIFO_vcomp (111) EXPLORED(20)
    |       +--FIFO_contorl_vocmp (112) PASS
    |       |   +--check_underflow (113) PASS
    |       |   +--check_overflow (114) PASS
    |       |
    |       +--FIFO_datapath_vcomp (115) EXPLORED(20)
    |           +--check_data_integrity (116) PASS
    |           +--check_data_sequencing (117) EXPLORED(20)
    |
    +--Arbiter (118) PASS
        +--Arbiter_vcomp (119) PASS
            +--check_arbiter_fair (120) PASS
            +--check_arbiter_no_starvation (121) PASS
            +--check_grant_onehot (122) PASS
```

U.S. PATENT DOCUMENTS

| | | | |
|---|---|---|---|
| 2008/0066030 A1* | 3/2008 | Hekmatpour et al. | 716/5 |
| 2008/0072196 A1* | 3/2008 | Hekmatpour et al. | 716/5 |
| 2008/0104556 A1* | 5/2008 | Yamada | 716/5 |
| 2009/0144680 A1* | 6/2009 | Lehavot et al. | 716/5 |

FOREIGN PATENT DOCUMENTS

| | | |
|---|---|---|
| WO | 2006035854 | 4/2006 |

OTHER PUBLICATIONS

Borrione et al., "On-line Assertion-Based Verification with Proven Correct Monitors", ITI 3rd International Conference on Information and Communications Technology, Dec. 5-6, 2005, pp. 125-143.*

Jabobo et al., "Design for Verification of SystemC Transaction Level Models", Proceedings of Design, Automation and Test in Europe, vol. 1, Mar. 7-11, 2005, pp. 560-565.*

Habibi et al., "Towards an Efficient Assertion Based Verificaiton of SystemC Designs", Ninth IEEE International High-Level Design Validation and Test Workshop, Nov. 10-12, 2004.*

Kamel et al., "Redundancy: An Approach to the Efficient Implementation of Semantic Integrity Assertions", Proceedings of the Twenty-Third Annual Hawaii International Conference on Systems Sciences, vol. 2, Jan. 2-5, 1990, pp. 393-399.*

Massonet et al., "Analogical Reuse of Requirements Frameworks," Proceedings of the Third IEEE International Symposium on Requirements Engineering, Jan. 6-10, 1997, pp. 26-37.*

Morin-Allory et al., "Asynchronous Assertion Monitors for Multi-Clock Domain System Verification", Seventeenth IEEE International Workshop on Rapid System Prototyping, Jun. 14-16, 2006, pp. 98-102.*

Accellera "Property Specification Language Reference Manual Version 1.1", Jun. 2004, pp. 1-131, located at http://www.eda.org/vfv/docs/PSL-v1.1.pdf.

Accellera "SystemVerilog 3.1a Language Reference Manual," Accellera's Extensions to Verlog, May 2004, pp. 1-568 located at http://www.eda.org/sv/SystemVerilog_3.1a.pdf.

Beer, I et al. "On-the-fly model checking of RCTL formulas" 10th International Conference on Computer Aided Verification (CAV '98), 1998, pp. 1-12, located at http://www.research.ibm.com/haifa/projects/verification/RB_Homepage/ps/ag-bool_f.ps.

Beer et al., "The Temporal Logic Sugar", 13th Conference on Computer-Aided Verification, Jul. 2001, pp. 363-367.

Ben-David, S. et al. "Automata construction for regular expressions in model checking" pp. 1-12, located at http://www.wisdom.weizmann.ac.il/{dana/publicat/pos-nfa.pdf.

Datta, K. et al. "Assertion based verfication using HDVL" Proceedings of the 17th International Conference on VLSI Design, Mumbai, India, Jan. 5-9, 2004, pp. 319-325.

Gawanmeh, A. et al., "Embedding and Verification of PSL Using AsmL", Proceedings of the International Conference on Abstract State Machines (ASM'05), Mar. 2005, pp. 201-216, Paris, France.

Gheorghita, S. V. et al., "Constructing Checkers From PSL Properties", Proceedings of the 15th International Conference on Control Systems and Computer Science 2, May 2005, pp. 757-762, ES [06.11], The Netherlands.

Gordon, M.J.C. "Validating the PSL/sugar semantics automated reasoning" Formal Aspects of Computing, Springer-Verlag, UK, Dec. 2003, vol. 15, No. 4, pp. 406-421.

Hopcroft, J. et al., "Introduction to Automata Theory, Languages, and Compuatation", 2nd edition, Addison-Wesley, 2001, 537 pages.

Maidl, M. "Common fragment of CTL and LTL" Proceedings of the 2000 IEEE Annual Symposium on Foundations of Computer Science, Los Alamitos, CA 2000, pp. 643-652.

Pacholik, A; et al., "Real Time Constraints in System Level Specifications Improving the Verificatoin Flow of Complex Systems", In: Proceedings of Net.ObjectDays 2005, Sep. 19-22, 2005, pp. 283-294.

Ruah, S. et al. "Automata construction for on-the-fly model checking PSL safety simple subset" pp. 1-22, located at http://www.wisdom.weizmann.ac.il/{dana/publicat/sefety_psl_det.pdf , Apr. 23, 2005.

Somenzi, F. "Efficient Buchi Automata from LTL Formulae", CAV'00, pp. 248-263, 2000.

Tuerk, T. et al., "From PSL to LTL: A Formal Validation in HOL", Proceedings of the International Conference on Theorem Proving in Higher Order Logics (TPHOL), Aug. 22, 2005, pp. 342-357, Springer-Verlag, Germany.

Supplemental Search Report dated Mar. 1, 2007 for European Applicaton No. 05852297.0.

Non-Final Office Action dated Jan. 12, 2010 for U.S. Appl. No. 11/711,950.

* cited by examiner

400

```
DUV (101)
  |
  +--FIFO1 (102)
  |    +--FIFO_vcomp (103)
  |         +--FIFO_contorl_vocmp (104)
  |         |    +--check_underflow (105)
  |         |    +--check_overflow (106)
  |         |
  |         +--FIFO_datapath_vcomp (107)
  |              +--check_data_integrity (108)
  |              +--check_data_sequencing (109)
  |
  +--FIFO2 (110)
  |    +--FIFO_vcomp (111)
  |         +--FIFO_contorl_vocmp (112)
  |         |    +--check_underflow (113)
  |         |    +--check_overflow (114)
  |         |
  |         +--FIFO_datapath_vcomp (115)
  |              +--check_data_integrity (116)
  |              +--check_data_sequencing (117)
  |
  +--Arbiter (118)
       +--Arbiter_vcomp (119)
            +--check_arbiter_fair (120)
            +--check_arbiter_no_starvation (121)
            +--check_grant_onehot (122)
```

```
DUV (101) FAIL(10),CEX1
 |
 +--FIFO1 (102) FAIL(10),CEX1
 |     +--FIFO_vcomp (103) FAIL(10),CEX1
 |           +--FIFO_contorl_vocmp (104) FAIL(10),CEX1
 |           |     +--check_underflow (105) FAIL(10),CEX1
 |           |     +--check_overflow (106) PASS
 |           |
 |           +--FIFO_datapath_vcomp (107) PASS
 |                 +--check_data_integrity (108) PASS
 |                 +--check_data_sequencing (109) PASS
 |
 +--FIFO2 (110) EXPLORED(20)
 |     +--FIFO_vcomp (111) EXPLORED(20)
 |           +--FIFO_contorl_vocmp (112) PASS
 |           |     +--check_underflow (113) PASS
 |           |     +--check_overflow (114) PASS
 |           |
 |           +--FIFO_datapath_vcomp (115) EXPLORED(20)
 |                 +--check_data_integrity (116) PASS
 |                 +--check_data_sequencing (117) EXPLORED(20)
 |
 +--Arbiter (118) PASS
       +--Arbiter_vcomp (119) PASS
             +--check_arbiter_fair (120) PASS
             +--check_arbiter_no_starvation (121) PASS
             +--check_grant_onehot (122) PASS
```

DUV (101) FAIL(10),CEX1
 |
 +--FIFO1 (102) FAIL(10),CEX1
 |    +--FIFO_vcomp (103) FAIL(10),CEX1
 |         +--FIFO_contorl_vocmp (104) FAIL(10),CEX1
 |         |    +--check_underflow (105) FAIL(10),CEX1
 |         |    +--check_overflow (106) Not_run
 |         |
 |         +--FIFO_datapath_vcomp (107) PASS
 |              +--check_data_integrity (108) PASS
 |              +--check_data_sequencing (109) PASS
 |
 +--FIFO2 (110) EXPLORED(20)
 |    +--FIFO_vcomp (111) EXPLORED(20)
 |         +--FIFO_contorl_vocmp (112) PASS
 |         |    +--check_underflow (113) PASS
 |         |    +--check_overflow (114) PASS
 |         |
 |         +--FIFO_datapath_vcomp (115) EXPLORED(20)
 |              +--check_data_integrity (116) PASS
 |              +--check_data_sequencing (117) EXPLORED(20)
 |
 +--Arbiter (118) PASS
      +--Arbiter_vcomp (119) PASS
           +--check_arbiter_fair (120) PASS
           +--check_arbiter_no_starvation (121) PASS
           +--check_grant_onehot (122) PASS
```

FIG. 6

```
DUV (101) FAIL(10),CEX1
 |
 +--FIFO1 (102) FAIL(10),CEX1
 |    +--FIFO_vcomp (103) FAIL(10),CEX1
 |        +--FIFO_contorl_vocmp (104) FAIL(10),CEX1
 |        |    +--check_underflow (105) FAIL(10),CEX1
 |        |    +--check_overflow (106) Not_run
 |        |
 |        +--FIFO_datapath_vcomp (107) Not_run
 |            +--check_data_integrity (108) Not_run
 |            +--check_data_sequencing (109) Not_run
 |
 +--FIFO2 (110) EXPLORED(20)
 |    +--FIFO_vcomp (111) EXPLORED(20)
 |        +--FIFO_contorl_vocmp (112) PASS
 |        |    +--check_underflow (113) PASS
 |        |    +--check_overflow (114) PASS
 |        |
 |        +--FIFO_datapath_vcomp (115) EXPLORED(20)
 |            +--check_data_integrity (116) PASS
 |            +--check_data_sequencing (117) EXPLORED(20)
 |
 +--Arbiter (118) PASS
      +--Arbiter_vcomp (119) PASS
           +--check_arbiter_fair (120) PASS
           +--check_arbiter_no_starvation (121) PASS
           +--check_grant_onehot (122) PASS
```

```
DUV (101) FAIL(10),CEX1
 |
 +--FIFO1 (102) FAIL(10),CEX1
 |    +--FIFO_vcomp (103) FAIL(10),CEX1
 |        +--FIFO_contorl_vocmp (104) FAIL(10),CEX1
 |        |    +--check_underflow (105) FAIL(10),CEX1
 |        |    +--check_overflow (106) Not_run
 |        |
 |        +--FIFO_datapath_vcomp (107) Not_run
 |            +--check_data_integrity (108) Not_run
 |            +--check_data_sequencing (109) Not_run
 |
 +--FIFO2 (110) Not_run
 |    +--FIFO_vcomp (111) Not_run
 |        +--FIFO_contorl_vocmp (112) Not_run
 |        |    +--check_underflow (113) Not_run
 |        |    +--check_overflow (114) Not_run
 |        |
 |        +--FIFO_datapath_vcomp (115) Not_run
 |            +--check_data_integrity (116) Not_run
 |            +--check_data_sequencing (117) Not_run
 |
 +--Arbiter (118) Not_run
     +--Arbiter_vcomp (119) Not_run
         +--check_arbiter_fair (120) Not_run
         +--check_arbiter_no_starvation (121) Not_run
         +--check_grant_onehot (122) Not_run
```

FIG. 8

METHOD AND SYSTEM FOR HANDLING ASSERTION LIBRARIES IN FUNCTIONAL VERIFICATION

BACKGROUND

1. Field

The field of the present invention relates to verification technology of digital designs, and in particular, to a method and system for handling assertion libraries in functional verification.

2. Description of Related Art

For logic verification of digital designs, various techniques, such as formal verification, simulation and acceleration, are used. One of the verification mechanisms that are used in these techniques is Assertion Based Verification (ABV).

In ABV, assertions monitor design behavior against behavior specified in the assertion. Assertions provide a terse way to specify the behavior to be checked and are usable in the verification flow. Assertions may be written on the interface of the block being checked or on the internal signals. Assertions may specify a variety of behavior including safety assertions for specifying that something bad should not happen and liveness assertions for specifying that something good should eventually happen.

Typically, a single assertion in itself specifies only a part of the behavior. In general, to specify the behavior of a design block, a set of assertions is needed. Assertions are categorized based on whether it specifies the behavior of the inputs (or environment) or the outputs (current design under test). This bifurcation assists in making the input assertions as constraints for formal verification.

Assertions specify behavior in a variety of temporal logics. The most commonly used temporal logics are LTL (Linear-Time-Logic) and CTL (Computation Tree Logic). Assertion languages are used to specify this behavior. Some of the standard languages for assertions are IEEE 1850 PSL (Property Specification Language) and IEEE1800 SVA (System Verilog Assertions). In general, these languages provide basic constructs to specify design behavior. Design behavior is coded by a set of assertions that specify a part of the behavior.

SUMMARY

Design behavior may be specified with assertion libraries. Assertion libraries provide pre-coded standard checkers meant for checking pre-specified functionality. Some such libraries are the OVL (Open Verification Library) and IAL (Cadence® Incisive Assertion Library).

Assertion libraries may be implemented in verification tools. In one aspect, some verification tools may natively support the library so as to not require the user to provide the definition of library elements to the verification tool. In another aspect, this native support may limit the support to standard libraries only.

Another method is to implement the assertion library elements in terms of IEEE 1850 PSL (Property Specification Language) and IEEE1800 SVA (System Verilog Assertions) constructs so that verification tools supporting PSL/SVA may also support the assertion library. In yet another method, each assertion library element may comprise more than one PSL/SVA assertion to specify the behavior of that library element.

The mechanism of packaging a set of related assertions is used for design verification, wherein desired behavior may be coded in a set of assertions packaged as a library component. This component may be instantiated in the design and the verification tool just needs to handle the base assertion languages.

In one embodiment, the assertion library element may be created and custom made for any specific requirement and does not have any dependence on the verification tool support for that element. Moreover, hierarchy of such library elements may be created, and its reporting may be achieved using rules describe herein.

Some embodiments of the invention disclose a method of abstracting results of assertion based verification at various levels of hierarchy. This method gives a quick view of verification results. This method of abstraction is also able to improve verification performance by deciding to not perform certain redundant verification. This method is applicable to assertion based verification achieved by using various techniques including formal verification, simulation and emulation.

Assertion Based Verification (ABV) uses assertions written in PSL and/or SVA to specify design behavior to be checked. These assertions may be used in a variety of verification flows including formal verification, simulation and emulation. Assertions specify the behavior to be checked at a high level of abstraction. For complex protocol verification, behavior may be described using a set of assertions rather than a single assertion. Assertion verification IPs are created hierarchically and are composed of many assertions distributed across hierarchy. For verification of protocol and design behavior, a library of verification components may be created. Each component may include a set of assertions and checks a particular behavior of the protocol.

Some embodiments of the invention disclose various techniques of building-up a single status from an entire set of assertions and verification components. Some embodiments of the invention disclose various attributes of an assertion status that may be calculated and consolidated at the library level. A means for visualizing the information with different modes of user interface is also disclosed. Some embodiments of the invention disclose possible optimization during verification as a result of status resolution.

Some embodiments of the invention disclose a method and system for handling assertion libraries in verification of a design including implementing at least one verification component in at least one of the assertion libraries with at least one standard assertion language supported by at least one verification tool, packaging a set of related assertions for design verification, creating an assertion library element for a specific requirement without dependence on the at least one verification tool for that element, and verifying the design.

Some embodiments of the invention disclose a method and system for handling assertion libraries in verification of a design including structuring and implementing at least one verification component in at least one of the assertion libraries with at least one standard assertion language supported by at least one verification tool, creating an assertion library element for a specific requirement for verification of the design without dependence on the at least one verification tool for the assertion library element, and resolving assertion status during or after verification when doing ABV using verification components and/or PSL/SVA assertions In one embodiment, visualization of assertion status at various levels of design hierarchy and at verification component level may be achieved, and implementing verification techniques may include optimization techniques during and/or after verification.

These and other objects and advantages of the present teachings will become more fully apparent from the following description taken in conjunction with the accompanying drawings.

BRIEF DESCRIPTION OF DRAWINGS

FIG. 4 shows one embodiment of an assertion hierarchy for the verification setup of FIG. 3.

FIG. 5 shows one embodiment of a resolution of assertion status at various levels of hierarchy in context of formal verification.

FIGS. 6-8 show various embodiments of optimization techniques.

DETAILED DESCRIPTION

Figure 1A:
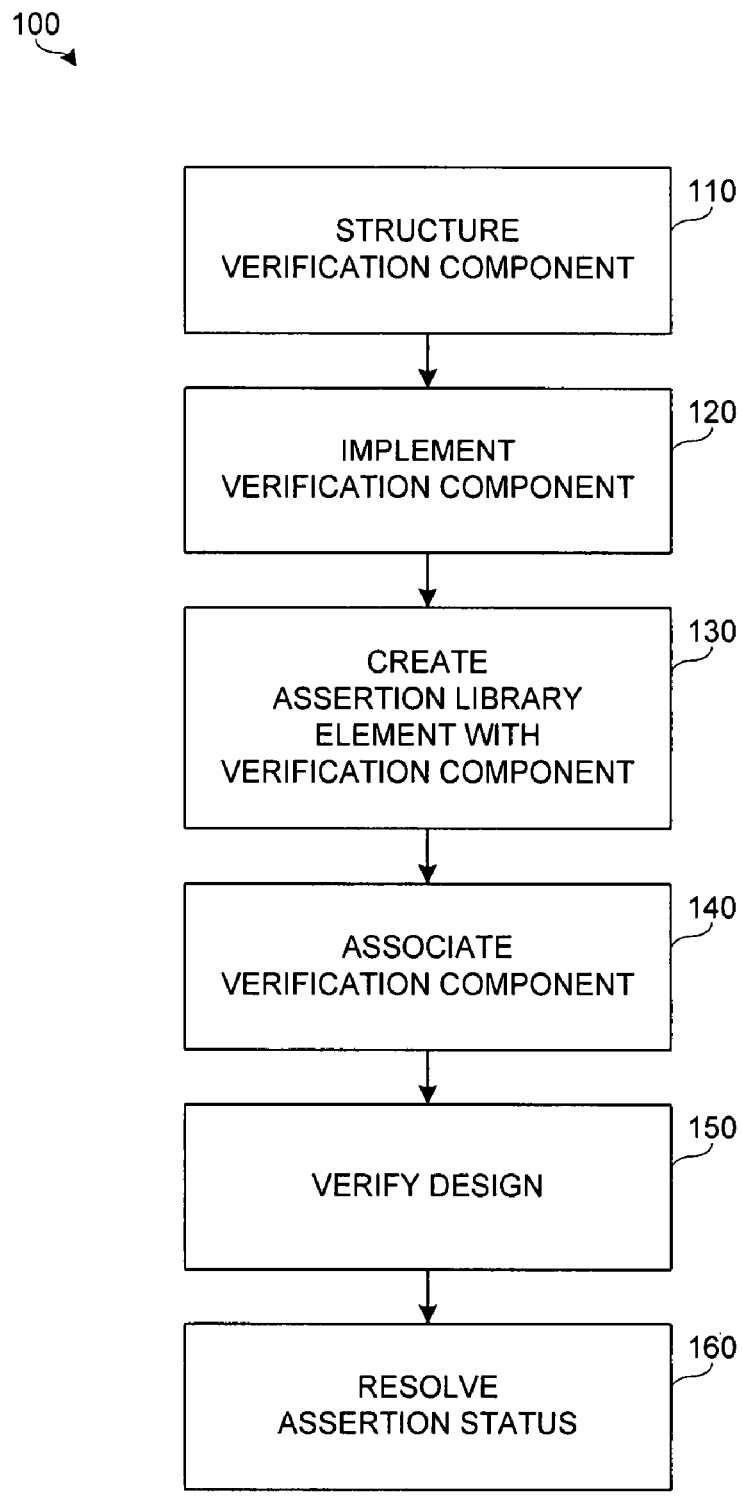
FIG. 1A shows one embodiment of a method for handling assertion libraries in verification of a design.

Various embodiments of the present invention are described hereinafter with reference to the drawings. It should be noted that the drawings are not drawn to scale and that elements of similar structures or functions are represented by like reference numerals throughout the drawings.

FIG. 1A shows one embodiment of a method 100 for handling assertion libraries in verification of a design. In 110, at least one verification component is structured for target verification. In 120, the at least one verification component is implemented using PSL/SVA properties and optionally using additional auxiliary RTL code. In 130, the at least one verification component is made and/or used to create an assertion library. In 140, the at least one verification component is associated with a design being verified. In 150, the design is verified using a specified verification tool. In 160, assertion status is resolved.

In one implementation, the assertion status is resolved after design verification in action 150. Alternatively, in another implementation, the assertion status is resolved "on the fly" during the design verification of action 150.

Further discussion and explanation of the method 100 and actions 110, 120, 130, 140, 150, 160 will be described in greater detail herein. It should be appreciated that, in various aspects, verification of the design may include functional verification and/or formal verification.

Assertion Based Verification (ABV) uses assertions written in standard property specification languages for verification. The standard languages include IEEE 1850 PSL (Property Specification Language) and IEEE1800 SVA (System Verilog Assertions). Assertions specify behavior of a design to be checked by a verification tool. Assertions specify behavior at a higher level of abstraction than the RTL (Register Transfer Level). In one aspect, RTL may be written in various types of HDL languages, such as Verilog and/or VHDL languages. In one aspect, it may be easier to specify a simple behavior using assertions rather than a complex behavior. As the complexity of an assertion increases, the chances of assertion being incorrect may also increase. Thus, writing multiple simple assertions to verify a complex behavior may be preferred over writing a less number of highly complex assertions.

In one embodiment, verification components may be supported with a library of assertions in a collection of one or more verification components. Each verification component may comprise a hierarchical HDL instance with a list of input ports and a set of assertions that specify behavior to be checked on those input ports.

In one embodiment, a verification component may include one or more input ports, some auxiliary HDL code, and more instances of other verification components. In case no ports are indicated, OOMRs (Out-Of-Module-References) may be used to refer to design signals, and a set of assertions/assumptions/cover may be written on these inputs or through OOMR on other design signals. In general, an OOMR (Out-Of-Module-Reference) is a feature of the Verilog language, which is to read module signals without identifying the module signal as a module port.

Figure 1B:
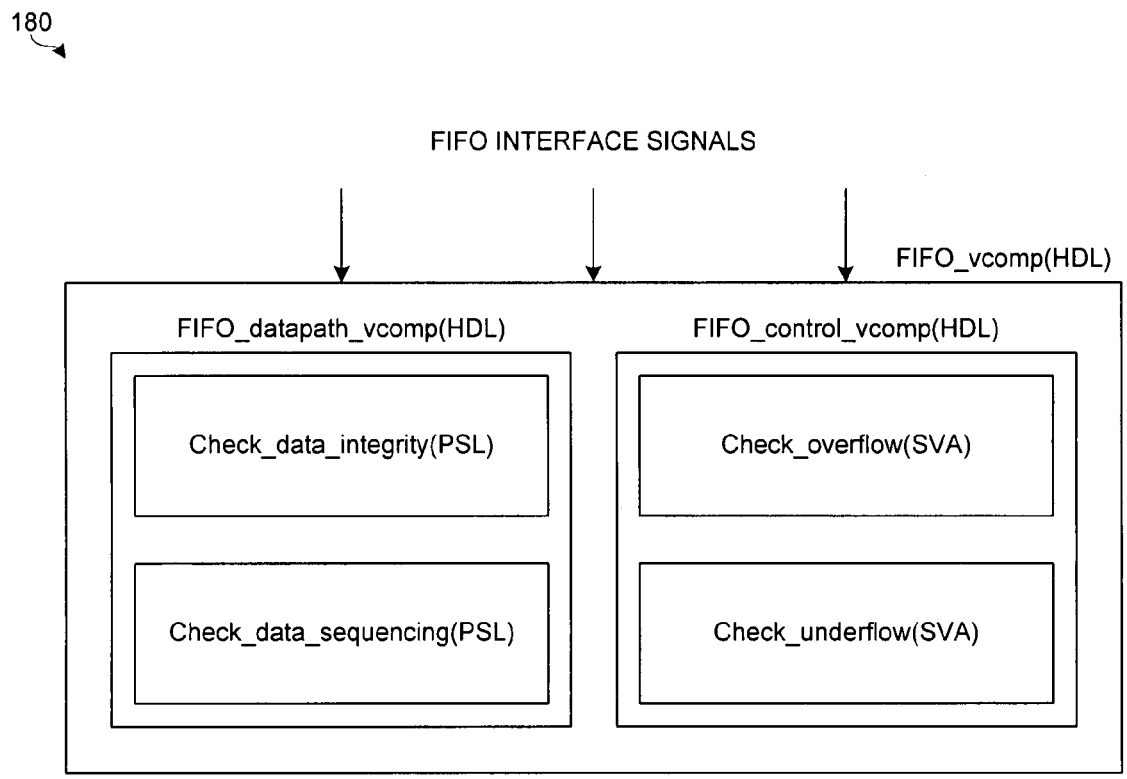
FIG. 1B shows one embodiment of a verification component, which may be referred to as vcomp.

FIG. 1B shows one embodiment of a verification component 180 to verify a FIFO (First In First Out). In one aspect, FIFO_vcomp comprises the verification component for complete FIFO. It may take all FIFO interface signals as inputs. It may be composed of two more verification components, the fifo_datapath_vcomp and fifo_control_vcomp. Each of the children verification components may comprise a set of actual assertions written in some assertion language, such as PSL/SVA.

In one embodiment, a verification component may specify behavior of a set of signals in a precise manner using a set of simple assertions. In one aspect, since individual assertions may be simple, they may be less prone to error as compared to a single complex assertion.

A user may need to track a large number of assertions. A large number of assertions may result in a large number of different statuses on these assertions. In one aspect, the user may not receive a consolidated top level picture of whether the behavior holds or does not hold.

Some embodiments of the invention include a technique of reporting of verification status at the level of verification component library. Using this technique, a verification tool achieves a single status for a verification component. The technique may be applicable to all forms of assertion based verification with slight variations as disclosed herein.

In one embodiment, formal verification, which may also be referred to as static verification, uses model-checking technology to prove or disprove a given assertion on a given design. Following are the possible statuses that a formal verification tool may give for an assertion.

Passed: The given assertion holds on the given design.

Failed (CEX): The given assertion does not hold on the given design. In one aspect, this status may have an associated failure trace or counterexample (CEX) that shows a trace on which the assertion fails. In another aspect, this status may always have an associated failure trace or counterexample (CEX) that shows a trace on which the assertion fails.

Explored (Depth): The verification problem may not be completed in the time given to the verification tool. However, this status has an associated depth value that tells how far, in terms of sequential depth, the verification tool verified. In one aspect, it may be guaranteed that the assertion does not fail till this depth.

Blocked: The proof was blocked due to bus-contention or a combinational loop in the design. In one aspect, a reason for blocked status may also be implementation dependent.

Running: The verification of this assertion is currently going on.

Not_run: The assertion has not yet been run and is in the run queue.

Some embodiments of the invention include a technique of resolving the status of all child assertions to a single library level status. For status resolution, the following rules may be applied. In one aspect, a dominating child assertion may include an assertion whose status may be taken as the status of the entire verification component. In another aspect, any associated information, such as a counterexample or depth of the dominating child, may be valid at the verification component level.

Rule 1. Iterate over all the child assertions; if any child assertion has a status "Blocked", this child assertion becomes the dominating child.

Rule 2. Else, iterate over all the child assertions; if any child assertion has a status "Failed", this child assertion becomes the dominating child.

Rule 3. Else, iterate over all the child assertions; if any child assertion has a status "Running", this child assertion becomes the dominating child.

Rule 4. Else, iterate over all the child assertions; if any child assertion has a status "Not_run", this child assertion becomes the dominating child.

Rule 5. Else, iterate over all the child assertions; get a list of assertions with status "Explored" and their associated verification depth. If the list is not empty, then the assertion with least depth becomes the dominating child.

Rule 6. Else, all the child assertions have status "Pass". Take any child assertion and that is the dominating child.

In one embodiment, once a dominating child is found, there is no need to apply any further rules, and the status of the dominating child becomes the status of the verification library component.

In one aspect, resolution may be achieved by the following means:

Dynamic Resolution of Status: This may be done when verification is still in progress and status of only some child assertions are available. In one aspect, this may be used to vary optimization.

Static Resolution of Status: This is done after verification is complete and status of all the child assertions is available.

Possible optimizations may include the following. When doing dynamic resolution of status, the status resolution is done on any change in the status of any assertion in the design. Using this information, a method of reducing redundant verification and reducing verification time may be provided. In one aspect, optimization level is selectable. For example, consider a verification component without any hierarchy and with two assertions. If the first assertion fails, then running of the second assertion may be skipped due to a result of less consequence. Alternatively, stopping the entire verification may be decided on first failure in the entire design. In one aspect, these parameter settings are shown in FIGS. 4-8.

In some embodiments of the present method, a parameter may decide the assertions that should not be verified if some other assertions fail during verification.

Parameter value 0: No optimization, run all assertions.

Parameter value 1: Do not run sibling assertions of the failed assertion. Run all other assertions.

Parameter value 2: Do not run sibling assertions. Do not run any assertion in the hierarchy below siblings of the failed assertion's parent.

Parameter value 3: Same as above with going one level up to parent of parent.

Some embodiments of the invention include techniques of Assertion Based Verification (ABV) in Simulation/Emulation. In case of simulation, an assertion may have at least one of the following status.

Finished (count): A finished status means that the behavior specified in assertion was depicted by the simulation run. The count is the number of times this behavior has been observed till the current simulation time.

Failed (count): A failed status means that the behavior specified in the assertion was violated by the design behavior on the current simulation trace.

Not_checked: A not checked status means that the assertion has neither failed nor finished. In one aspect, either a match is currently in progress or the enabling condition of that assertion has not occurred.

In one embodiment, resolving various statuses to a single component level status, the following technique may be used. In one aspect, resolved status in this case may have collective counts of failures and finishes in the entire hierarchy tree below current level. The failed count at any level is the sum of failed counts of its child assertions and verification components. The finished count at any level is the sum of finished counts of its child assertions and verification components. If both failed count and finished count is zero then the resolved status is not checked.

Some embodiments of the invention include a status visualization technique. In one aspect, the status of a verification component is shown as a single entity. The overall status of the verification component is shown like the status of a single assertion. There are many assertions within the verification component, but the status reported is the overall status of the verification component. This facility may be referred to as the flat view. A user may view the status of individual assertions within the verification component using a text interface command. This may be referred to as a hierarchical view. In another aspect, a user may switch between the hierarchical view and the flat view at any point of time.

In the graphical user interface, the verification component is shown as a single assertion and a resolved status is shown for that assertion in a column next to the assertion column. To a user, it may appear that verification component is a single assertion. Within the verification component, there may be multiple assertions that are being proved by the verification tool. In one aspect, an expand facility may be provided in GUI through a "+" button so as to enables a user to see an expanded view of the assertions within the verification component by clicking that button. The user may quickly switch between these two views using this button.

It should be appreciated by those skilled in the art that, in one aspect, some verification tools natively support only PSL and SVA such that the verification tool is not able to show a consolidated or resolved status for the verification. In some cases, users create verification components to segregate the behavior to be checked, and the results are shown as individual PSL/SVA assertions.

With library level reporting in place, the verification tool may show, at each level of hierarchy, a resolved status of the assertions and verification components below that hierarchy. In one aspect, a user may control desired details, and many unwanted details may be hidden and shown only when requested.

Some verification tools adopt an approach of supporting complex assertions, such as an OVL (Open Verification Library) library. In one aspect, verification tools may have there own native support for each element of the OVL library and are able to show results at the verification component level without reducing to multiple assertions. In this case, support may be rigid and may not be extended beyond the standard library components. Hence, in this case, a user may not be able to modify the behavior or write custom library elements. With library level reporting in place, a user may write verification components and use them as a first class verification object, and the user may modify existing libraries, including a PSL version of OVL, and use it as a natively supported verification object.

With the optimization technique described above, redundant verification may be eliminated. The selection of optimization level gives power to control the meaning of redundant verification, which may lead to improvement in verification performance.

The technique to visualize the resolved status at any level of hierarchy provides a convenient means of viewing a consolidated status. The ability to expand the hierarchy at any level provides flexibility of abstract verification status view.

Some embodiments of the invention include resolving status from a set of assertions having possibly different statuses, resolving status for formal verification, resolving status for simulation, resolving status for emulation, resolving status from a set of verification components, resolving a counter example from the assertion below in hierarchy in case of resolved status being failed, and resolving depth of verification from a set of assertions. Some embodiments of the invention include hierarchical composition of the above rules, optimization of not-running other assertions once a failed status is resolved, selection of an optimization level to remove redundant verification runs, and visualization of resolved status at any level of hierarchy.

Figure 2:
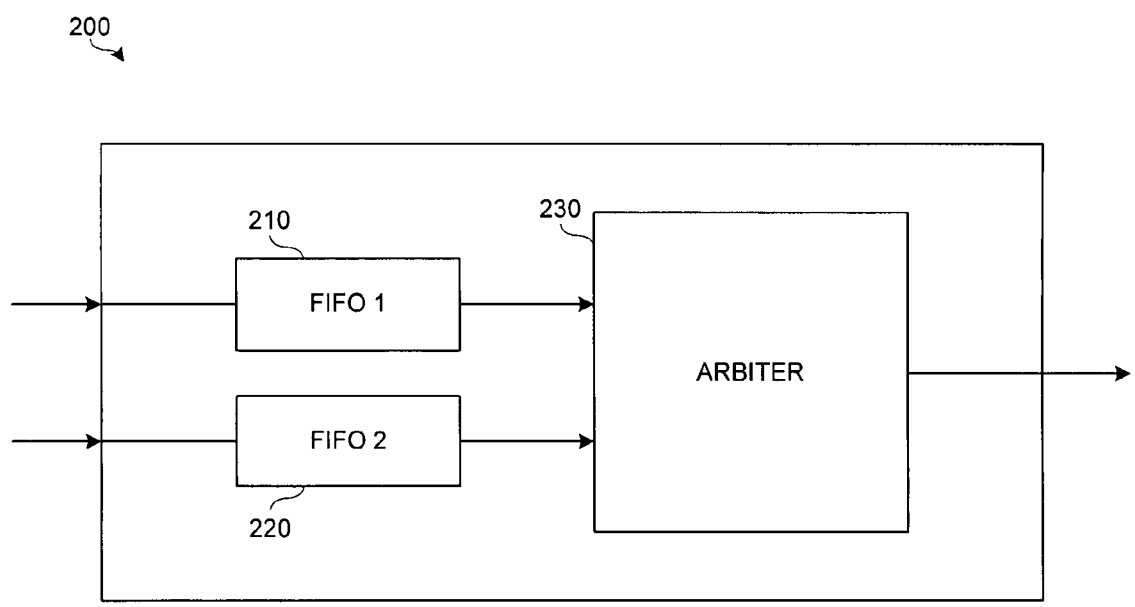
FIG. 2 shows one embodiment of a design construction.

FIG. 2 shows one embodiment of a design construction 200. In one aspect, the design 200 is hierarchical and has at least two instances of a FIFO module 210, 220, which is shown as FIFO_1 and FIFO_2. The design 200 includes an instance of an arbiter module 230.

Figure 3:
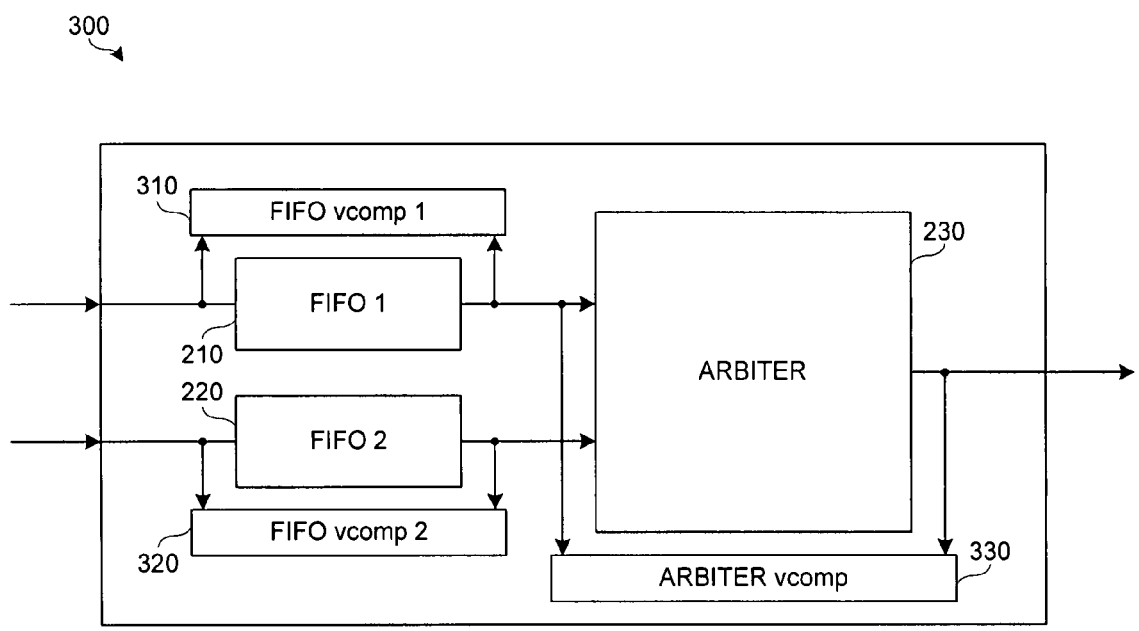
FIG. 3 shows one embodiment of a verification setup for the design of FIG. 2.

FIG. 3 shows a one embodiment of a verification setup 300 for the design 200 shown in FIG. 2. The verification setup 300 shows verification components 310, 320, 330 monitoring the behavior of respective modules 210, 220, 230 of the design 200. As shown in FIG. 3, FIFO_vcomp_1 310 monitors the behavior of instance FIFO_1 210, FIFO_vcomp_2 320 monitors the behavior of instance FIFO_2 220, and verification component Arbiter_vcomp 330 monitors the behavior of Arbiter instance 230 in the design 200.

FIG. 4 shows one embodiment of an assertion hierarchy 400 for the verification setup 300 in FIG. 3 (the numbers in parenthesis are for reference). In one aspect, the instance names starting with check_ comprise PSL or SVA assertions, and the remaining instance names comprise HDL hierarchy that defines either the verification component or the design module.

FIG. 5 shows one embodiment of a resolution 500 of assertion status at various levels of hierarchy in context of formal verification. In one aspect, the status of PSL and SVA assertions (those starting with check_ in this example) are given by the verification tool, and the remaining statuses may be computed based on various techniques, such as the algorithm for resolution of status, presented herein.

FIG. 6 shows one embodiment of the working 600 of the optimization technique described herein, wherein FIG. 6 shows results after setting the optimization level to 1. Note that check_overflow (106) has the status not_run. This is due to the fact that (105) has failed and becomes the dominating child. Hence, the status of other sibling assertions may not affect the resolved status.

FIG. 7 shows the working 700 of the optimization technique described herein, wherein FIG. 7 shows the results after setting optimization level to 2.

FIG. 8 shows the working 800 of the optimization technique described herein, wherein FIG. 8 shows the results after setting optimization level to 3.

Figure 9:
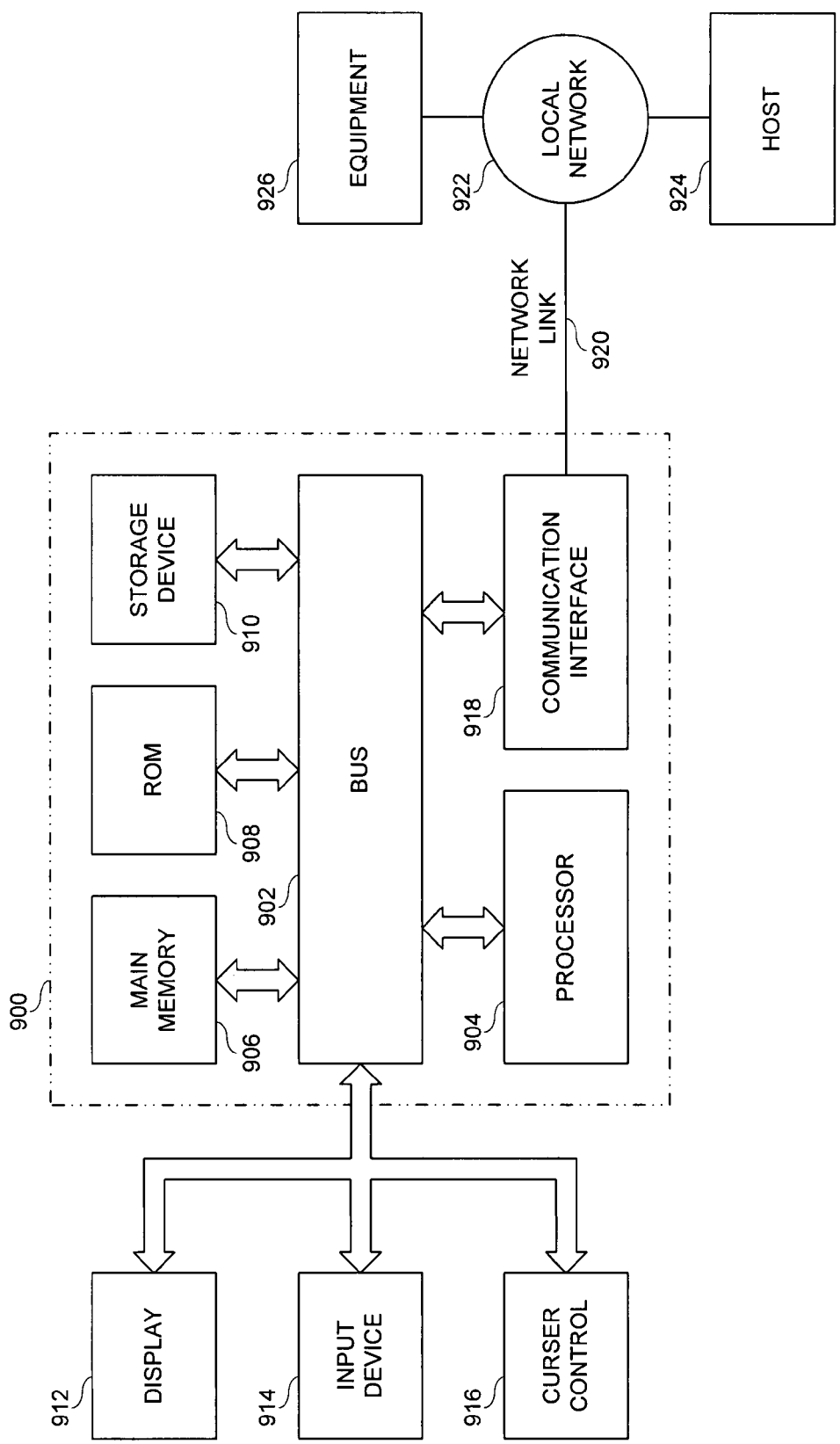
FIG. 9 shows one embodiment of a computer system with which embodiments of the invention may be implemented.

FIG. 9 shows an example of an embodiment of a block diagram of a computer system 900 that may be used to implement embodiments of the invention described herein. In particular, the computer system 900 stores and executes a computer software program for performing any of the functions or actions described herein. The computer system 900 includes a bus 902 or other communication mechanism for communicating information, and a processor 904 coupled with the bus 902 for processing information. The computer system 900 also includes a main memory 906, such as a random access memory (RAM) or other dynamic storage device, coupled to the bus 902 for storing information and instructions to be executed by the processor 904. The main memory 906 also may be used for storing temporary variables or other intermediate information during execution of instructions to be executed by the processor 904. The computer system 900 further includes a read only memory (ROM) 908 or other static storage device coupled to the bus 902 for storing static information and instructions for the processor 904. A data storage device 910, such as a magnetic disk or optical disk, is provided and coupled to the bus 902 for storing information and instructions.

The computer system 900 may be coupled via the bus 902 to a display 912, such as a cathode ray tube (CRT), for displaying information to a user. An input device 914, including alphanumeric and other keys, is coupled to the bus 902 for communicating information and command selections to processor 904. Another type of user input device is cursor control 916, such as a mouse, a trackball, or cursor, direction keys for communicating direction information and command selections to processor 904 and for controlling cursor movement on display 912. This input device typically has two degrees of freedom in two axes, a first axis (e.g., x) and a second axis (e.g., y), that allows the device to specify positions in a plane.

Embodiments of the invention are related to the use of computer system 900 for handling assertion libraries in functional verification. In one embodiment, such use is provided by computer system 900 in response to processor 904 executing one or more sequences of one or more instructions contained in the main memory 906. Such instructions may be read into the main memory 906 from another computer-readable medium, such as storage device 910. Execution of the sequences of instructions contained in the main memory 906 causes the processor 904 to perform the process actions described herein. One or more processors in a multi-processing arrangement may also be employed to execute the sequences of instructions contained in the main memory 906. In alternative embodiments, hard-wired circuitry may be used in place of or in combination with software instructions to implement some embodiments of the invention. Thus, embodiments of the invention are not limited to any specific combination of hardware circuitry and software.

The term "computer-readable medium" as used herein refers to any medium that participates in providing instructions to the processor 904 for execution. Such a medium may take many forms, including but not limited to, non-volatile media, volatile media, and transmission media. Non-volatile media includes, for example, optical or magnetic disks, such as the storage device 910. Volatile media includes dynamic memory, such as the main memory 906. Transmission media includes coaxial cables, copper wire and fiber optics, including the wires that comprise the bus 902. Transmission media may also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer may read.

Various forms of computer-readable media may be involved in carrying one or more sequences of one or more instructions to the processor 904 for execution. For example, the instructions may initially be carried on a magnetic disk of a remote computer. The remote computer may load the instructions into its dynamic memory and send the instructions over a telephone line using a modem. A modem local to the computer system 900 may receive the data on the telephone line and use an infrared transmitter to convert the data to an infrared signal. An infrared detector coupled to the bus 902 may receive the data carried in the infrared signal and place the data on the bus 902. The bus 902 carries the data to the main memory 906, from which the processor 904 retrieves and executes the instructions. The instructions received by the main memory 906 may optionally be stored on the storage device 910 either before or after execution by the processor 904.

The computer system 900 also includes a communication interface 918 coupled to the bus 902. The communication interface 918 provides a two-way data communication coupling to a network link 920 that is connected to a local network 922. For example, the communication interface 918 may be an integrated services digital network (ISDN) card or a modem to provide a data communication connection to a corresponding type of telephone line. As another example, the communication interface 918 may be a local area network (LAN) card to provide a data communication connection to a compatible LAN. Wireless links may also be implemented. In any such implementation, the communication interface 918 sends and receives electrical, electromagnetic or optical signals that carry data streams representing various types of information.

The network link 920 typically provides data communication through one or more networks to other devices. For example, the network link 920 may provide a connection through local network 922 to a host computer 924 or to another equipment 926. The data streams transported over the network link 920 may comprise electrical, electromagnetic or optical signals. The signals through the various networks and the signals on the network link 920 and through the communication interface 918, which carry data to and from the computer system 900, are exemplary forms of carrier waves transporting the information. The computer system 900 may send messages and receive data, including program code, through the network(s), the network link 920, and the communication interface 918.

Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed is:

1. A computer-implemented method for handling assertion libraries in verification of a design, the method comprising:

structuring and implementing at least one verification component for the verification of the design capable of being stored in at least one of the assertion libraries with at least one assertion language supported by at least one verification tool;

creating an assertion library element for a specific requirement for the verification of the design without dependence on the at least one verification tool for the assertion library element;

resolving assertion status by consolidating a set of assertion statuses during or after verification when doing assertion based verification (ABV) using the verification component and/or assertion, wherein the act of resolving assertion status is performed by using a processor; and storing the assertion status in a volatile or non-volatile computer readable medium or displaying the assertion status on a display device.

2. The method of claim 1, wherein resolving assertion status comprises resolving assertion status to a single library level status.

3. The method of claim 1, wherein resolving assertion status comprises resolving assertion status at one or more levels of hierarchy in context of functional or formal verification.

4. The method of claim 1, further comprising packaging a set of related assertions for design verification.

5. The method of claim 1, further comprising verifying the design.

6. The method of claim 1, wherein resolving assertion status comprises dynamically resolving assertion status during verification when status of one or more assertions are available.

7. The method of claim 1, wherein resolving assertion status comprises statically resolving assertion status after verification when status of assertions are available.

8. The method of claim 1, further comprising reporting status of design verification at verification component level.

9. The method of claim 1, further comprising reporting status of design verification at one or more levels of design hierarchy.

10. The method of claim 1, further comprising optimizing the design as a result of resolving the assertion status, wherein status resolution is provided on changes in the status of one or more assertions in the design.

11. The method of claim 10, wherein optimizing the design includes reducing redundant verification and reducing verification time.

12. The method of claim 10, wherein optimization includes a selectable level of optimization such that, if a first assertion fails, then running of a second assertion is skipped due to a result of less consequence or such that stopping is decided with a first failure in the design.

13. The method of claim 1, wherein behavior is specified with assertion libraries.

14. The method of claim 1, wherein assertion libraries provide pre-coded standard checkers for checking pre-specified functionality.

15. The method of claim 1, wherein the assertion libraries comprise at least one of an OVL (Open Verification Library) and an IAL (Cadence® Incisive Assertion Library).

16. The method of claim 1, further comprising creating a library of verification components, wherein each verification component includes a set of assertions having at least one assertion and checks a particular behavior of protocol.

17. The method of claim 1, wherein each assertion library element includes one or more PSL (Property Specification Language) or SVA (System Verilog Assertion) assertions to specify behavior of the library element.

18. The method of claim 1, wherein packaging a set of related assertions for design verification includes coding desired behavior in a set of assertions packaged as a library element, and wherein the packaged library element is instantiated in the design, and wherein the at least one verification tool handles base assertion languages.

19. The method of claim 1, further comprising creating a hierarchy of library elements using at least one rule.

20. The method of claim 19, further comprising abstracting results of assertion based verification at various levels of the hierarchy.

21. The method of claim 20, further comprising providing a view of at least one verification result.

22. The method of claim 1, further comprising specifying design behavior to be checked.

23. The method of claim 22, wherein behavior is specified using a set of assertions rather than a single assertion.

24. The method of claim 23, further comprising building-up a single status from an entire set of assertions and verification components.

25. A system for handling assertion libraries in verification of a design, the method comprising:
- means for structuring and implementing at least one verification component for the verification of the design capable of being stored in at least one of the assertion libraries with at least one assertion language supported by at least one verification tool;
- means for creating an assertion library element for a specific requirement for the verification of the design without dependence on the at least one verification tool for the assertion library element; and
- a processor for resolving assertion status by consolidating a set of assertion statuses; and
- a volatile or non-volatile computer readable medium for storing the assertion status or a display device for displaying the assertion status.

26. The system of claim 25, further comprising means for optimizing the design as a result of resolving the assertion status, wherein status resolution is provided on changes in the status of one or more assertions in the design.

27. The system of claim 26, wherein means for optimizing the design includes means for reducing redundant verification and means for reducing verification time.

28. The system of claim 26, wherein means for optimization includes a selectable level of optimization such that, if a first assertion fails, then running of a second assertion is skipped due to a result of less consequence or such that stopping is decided with a first failure in the design.

29. A volatile or non-volatile computer readable medium storing a computer program comprising instructions which, when executed by, a processing system, cause the system to perform a method for handling assertion libraries in verification of a design, the method comprising:
- structuring and implementing at least one verification component for the verification of the design capable of being stored in at least one of the assertion libraries with at least one assertion language supported by at least one verification tool;
- creating an assertion library element for a specific requirement for the verification of the design without dependence on the at least one verification tool for the assertion library element;
- resolving assertion status by consolidating a set of assertion statuses; and
- storing the assertion status or displaying the assertion status on a display device.

30. The computer readable medium of claim 29, wherein resolving assertion status includes visualization at one or more levels of design and verification component hierarchy.

31. The computer readable medium of claim 29, wherein during or after verification of the design, resolving assertion status of the at least one verification component occurs at one or more levels of hierarchy.

32. The computer readable medium of claim 29, wherein further comprising optimizing the design as a result of resolving the assertion status, wherein status resolution is provided on changes in the status of one or more assertions in the design.

33. The medium of claim 32, wherein optimizing the design includes reducing redundant verification and reducing verification time.

34. The medium of claim 32, wherein optimization includes a selectable level of optimization such that, if a first assertion fails, then running of a second assertion is skipped due to a result of less consequence or such that stopping is decided with a first failure in the design.

* * * * *